United States Patent [19]

Kannegundla

[11] Patent Number: 5,032,740
[45] Date of Patent: Jul. 16, 1991

[54] VOLTAGE LEVEL CONVERSION OF A CLOCK SIGNAL

[75] Inventor: Ram Kannegundla, Rochester, N.Y.

[73] Assignee: Eastman Kodak Company, Rochester, N.Y.

[21] Appl. No.: 432,021

[22] Filed: Nov. 6, 1989

[51] Int. Cl.⁵ .................. H03L 5/00; H03K 19/092
[52] U.S. Cl. ....................... 307/264; 307/475; 307/555; 358/147
[58] Field of Search .......... 307/269, 262, 261, 555, 307/264, 475; 328/109, 63, 155, 135

[56] References Cited

U.S. PATENT DOCUMENTS

| | | | |
|---|---|---|---|
| 4,583,008 | 4/1986 | Gruggett | 307/269 |
| 4,757,214 | 7/1988 | Kobayashi | 307/480 |
| 4,758,737 | 7/1988 | Hirano | 328/109 |
| 4,760,291 | 7/1988 | Nakajima et al. | 307/480 |
| 4,783,699 | 11/1988 | DePaul | 358/147 |
| 4,816,700 | 3/1989 | Imel | 307/269 |
| 4,851,711 | 7/1989 | Chan et al. | 307/269 |

Primary Examiner—Stanley D. Miller
Assistant Examiner—Richard Roseen
Attorney, Agent, or Firm—Raymond L. Owens

[57] ABSTRACT

The number of wires needed to supply a CCD sensor with the necessary control pulses is reduced by deriving such control pulses as the reset, sample and clamp pulses at the CCD sensor from an available source such as the horizontal clock signal. Although the horizontal clock signal may be significantly different in d-c reference level and amplitude from the needed control pulses, the control pulses are generated by translating the horizontal clock signal to a signal of the needed d-c reference level and amplitude and properly timing the generation of the necessary control pulses.

4 Claims, 4 Drawing Sheets

FIG. 3
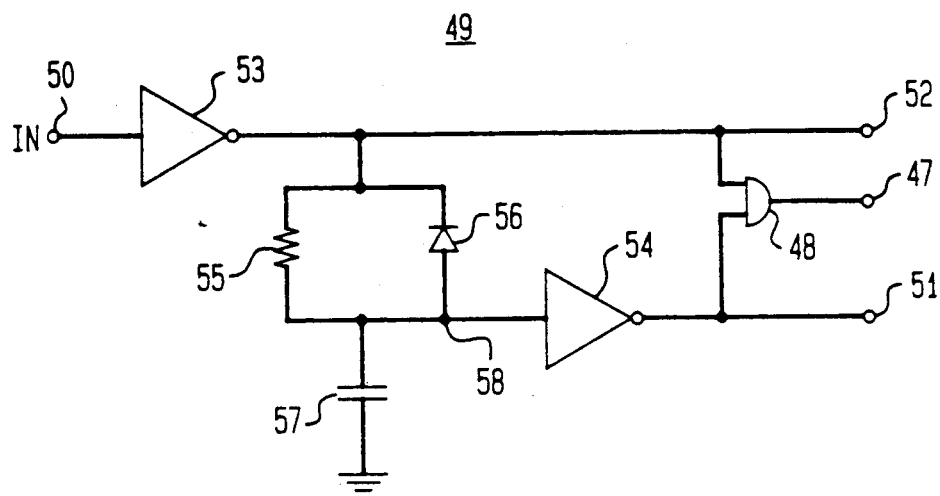
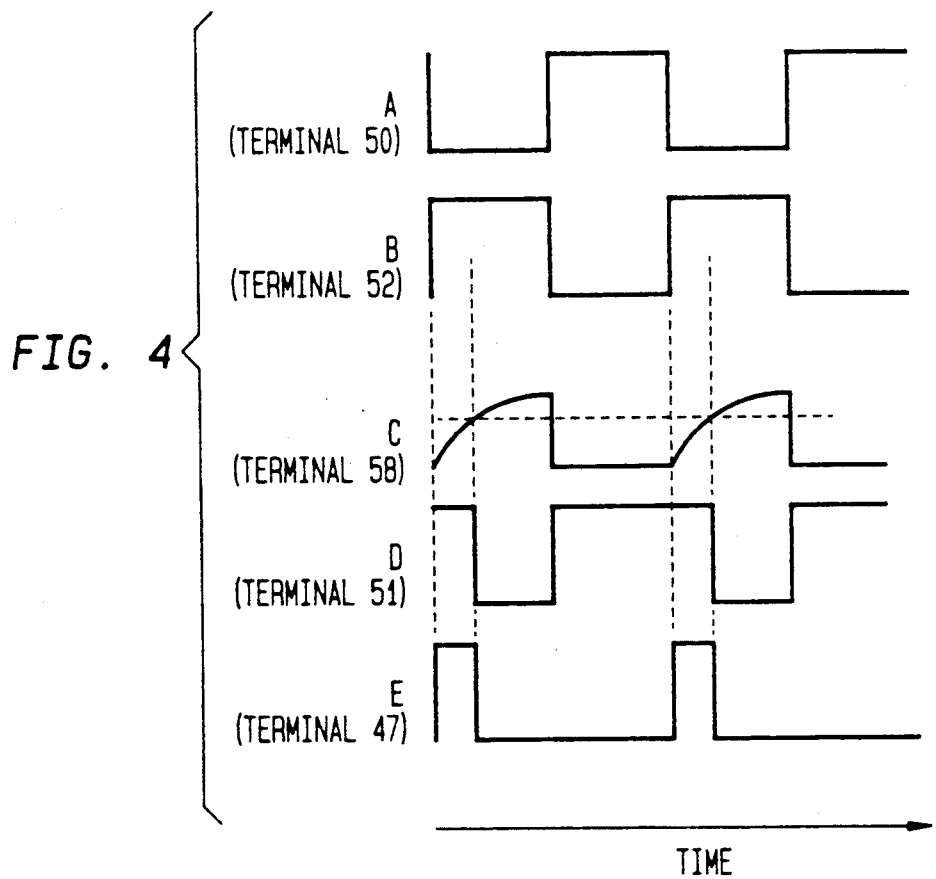
FIG. 4

VOLTAGE LEVEL CONVERSION OF A CLOCK SIGNAL

FIELD OF THE INVENTION

This invention relates generally to systems for operating charge coupled devices (CCD's) and more particularly to arrangements for reducing the number of external connecting wires needed for such operation.

BACKGROUND OF THE INVENTION

When used for electronic imaging, the photo sensitive devices known as CCD's require a number of different control pulses for proper operation. Normally, a reset pulse biases an output field effect transistor (FET) on the CCD to a precharge level and horizontal clock signals remove the charge representing the information from the CCD. A correlated double sample and hold circuit is often used to extract the value of the video signal from the CCD and it needs precisely positioned clamp and sample pulses. All of these signals, plus others, need to be supplied to the CCD and its associated circuitry to ensure proper operation.

A video camera using a CCD sensor is much reduced in size from one using a vidicon tube because of the much smaller size of a CCD. Medical and some industrial applications, however, demand still smaller sizes of imaging systems. The tip of a pencil may, for example, represent the size needed for some applications. Integrating the sample and hold circuitry on a CCD helps reduce both the number of external parts and the bandwidth needed to transmit the electrical output signal. Without more, however, the number of wires leading to the CCD sensor to supply the necessary control signals from external electronics is still large enough to make any connecting cable undesirably large and bulky. Unfortunately, both the d c reference levels and the amplitudes of the clock signals required by &he CCD tend to vary widely in different applications, making it extremely difficult to rely upon such clock signals as sources for the generation of other control pulses at the transistor transistor logic (TTL) voltage levels likely to be required.

Accordingly, a need exists for reducing the number of wires leading to a CCD sensor from the external electronics without detracting from proper system operation. There is also a related need for generating TTL level control pulses from CCD clock signals which may differ widely in amplitude and d-c reference level from one application to another.

SUMMARY OF THE INVENTION

The present invention is directed to a CCD system with a reduced number of wires leading to a CCD sensor of the system from external electronics. The reduction in the number of connecting wires is made possible by generating such control pulses as the reset, sample, and clamp pulses at a TTL voltage level directly from an available clock signal but with complete independence from the d-c reference level and amplitude of that clock signal. Because fewer connecting wires are needed, the cable connecting the CCD sensor to its external electronics may be significantly reduced in size and the imaging system as a whole made more suitable for applications demanding such smaller size.

In accordance with one particular aspect of the invention, a CCD operating system having a remote control source supplying at least one clock signal for a CCD sensor of the system over external connections translates both the d-c reference level and the amplitude of the clock signal to a predetermined fixed d-c reference level and amplitude, delays the clock signal by a predetermined amount to form a delayed signal, and combines the translated clock signal and the delayed signal with appropriate logic to generate the required control pulses.

From another point of view, the invention takes the form of the control pulse generating mechanism itself, which can be integrated with a CCD sensor along with sample and hold circuitry. From this aspect, the invention may be looked upon as an arrangement for generating CCD control pulses at a TTL voltage level independently of the amplitude and d-c reference level of the clock signal. In particular, the arrangement includes means to translate both the d-c reference level and the amplitude of the clock signal to a predetermined d-c reference level and amplitude, means to delay the clock signal by a predetermined amount to form a delayed signal, and appropriate logic means to combine the translated clock signal and the delayed signal to generate the needed control pulses.

In some specific embodiments of the invention, the control pulses which are generated are the reset pulses needed for a CCD sensor and the sample and clamp pulses needed for a double correlated sample and hold circuit integrated with the CCD sensor. The clock signal used for generation of these control pulses may, advantageously in many instances, be the horizontal clock driver signal. The arrangement for generating a shifted clock signal independent in amplitude and d c reference level of the clock signal received from external electronics may broadly take the form of an n-channel FET, operating under the control of the clock signal a& clock voltage amplitudes above a certain level to connect alternately between two voltages which are independent of the d-c reference level and amplitude of the clock signal and constitute the new d-c reference level and amplitude needed or as a source follower at clock voltage amplitudes below &hat level to achieve the same result. In a number of specific applications, the new voltages at TTL levels are particularly those needed to establish the d-c reference level and amplitude needed for the reset, sample, and clamp pulses.

Viewed from still another aspect, the invention is directed to circuitry which forms a portion of a CCD system that is responsive to a clock signal. The circuitry comprises means for delaying one edge of the clock signal by a predetermined amount to generate a second delayed edge clock signal; and logic means, which has inputs coupled to the clock signal and to the delayed edge clock signal and has an output coupled to a circuitry output terminal, for generating a control signal useful with the CCD system.

Viewed from yet another aspect, the invention is directed to circuitry that provides a delayed edge of a voltage waveform. The circuitry comprises first and second inverters each having an input and an output and delay means having a first terminal coupled to the output of the first inverter and a second terminal coupled to the input of the second inverter. A circuitry input terminal is coupled to the input of the first inverter.

Viewed from yet another aspect, the invention is directed to circuitry that provides a voltage level and amplitude translation. The circuitry comprises a switching device having a control &terminal and first and second output terminals, a diode, first, second and third resistors and ac coupling means having first and second terminals. The coupling means couples an ac component of a signal applied to the first terminal thereof to the second terminal thereof. A circuitry input terminal is coupled &o the first terminal of the ac coupling means. A circuitry output terminal is coupled to the first output terminal of the switching device and to a first terminal of the first resistor. A first &terminal of the second resistor is coupled to the anode of the diode and the cathode of the diode is coupled to the second terminal of the ac coupling means and to the control terminal of the switching device. A first terminal of the third resistor is coupled to the second output terminal of the switching device. Second terminals of the second and third resistors are coupled to a first voltage supply terminal; and a second terminal of the first resistor being coupled to a second voltage supply terminal.

The invention will be better understood from the following more de&ailed description, taken in the light of the accompanying drawing and appended claims.

BRIEF DESCRIPTION OF THE DRAWING

FIG. 3 is a circuit in accordance with the invention which is useful as part of the CCD sensor system of FIG. 2;

FIG. 4 graphically shows voltage waveforms which illustrate the operation of the circuit of FIG. 3;

DETAILED DESCRIPTION

Figure 1:
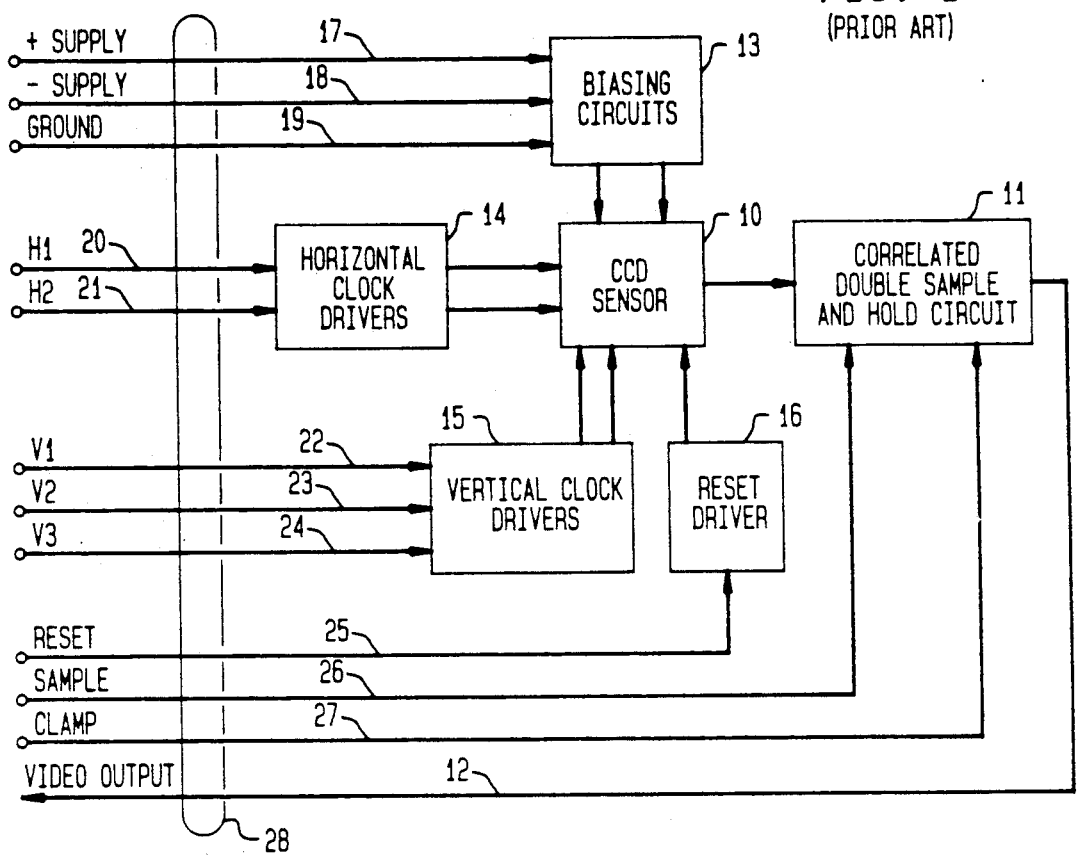
FIG. 1 is a block diagram of a prior art CCD sensor system.

Referring now to FIG. 1, there is shown a prior art CCD sensor system comprising a CCD sensor 10, biasing circuits 13, horizontal clock drivers 14, vertical clock drivers 15, a reset driver 16 and correlated double sample and hold circuit 11. CCD sensor 10 supplies an output to a correlated double sample and hold circuit 11 which, in turn drives a video output lead 12. Biasing circuits 13, horizontal clock drivers 14, vertical clock drivers 15 and reset driver 16 all drive CCD sensor 10 from an external electronic supply source (not shown). The biasing circuits 13 supply input to CCD sensor 10, as shown, as do the horizontal clock drivers 14 (for reading out information), the vertical clock drivers 15, and the reset driver 16 (to bias the output FET of the CCD to a precharge level). Biasing circuits 13 have three leads 17, 18 and 19 connected to them, supplying positive, negative, and ground potentials, respectively. Horizontal clock drivers 14 have two leads 20 and 21 supplying oppositely phased horizontal clock signals H1 and H2, while vertical clock drivers 15 have three leads 22, 23 and 24 supplying oppositely phased and d c reference vertical clock signals V1, V2 and V3. Reset driver 16 has a lead 25 receiving reset pulses, and correlated double sample and hold circuit 11 has two leads 26 and 27 receiving sample and clamp pulses, respectively. The latter two pulses hold the precharge and video levels of the CCD output. In general, the reset, sample, and clamp pulses received on leads 25, 26, and 27 are at TTL levels and need to be generated separately from any of the clock signals, which tend to be needed at a wide variety of different amplitudes and d-c reference levels. A cable 28 comprising conductors 12, 17, 18, 19, 20, 21, 22, 23, 24, 25, 26 and 27 couples needed power supplies, biasing signals and video output for the CCD sensor system.

A CCD sensor system like that shown in FIG. 1 is typically formed on a single semiconductor (e.g., silicon) body (substrate), integrated circuit chip) and includes a cable 28. While useful in many applications, this CCD sensor system presents problems in some medical and industrial applications in which small size is a significant advantage. As shown, there are at least eleven wires (conductors) going in&o the CCD sensor system and one coming out. This causes connecting cable 28 to be rather large and bulky. Such a connecting cable tends to defeat at least one of the purposes of using a CCD sensor, which is small size.

Figure 2:
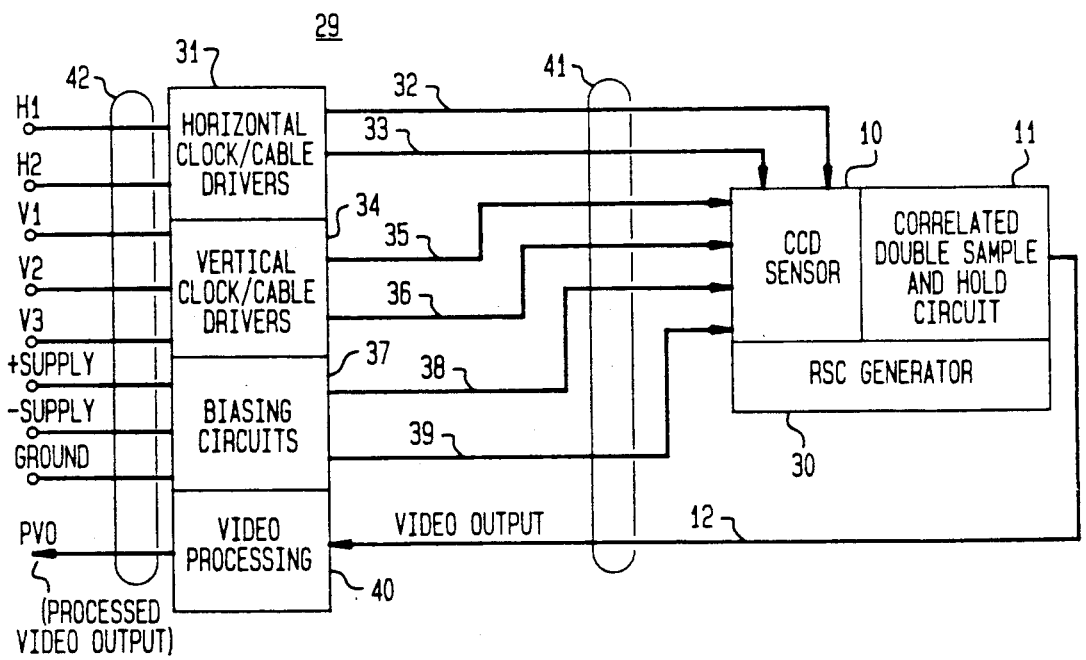
FIG. 2 is a block diagram of a CCD sensor system in accordance with the invention.

Referring &o FIG. 2, there is shown a CCD system 29 in accordance with the invention. CCD system 29 comprises horizontal clock/cable drivers 31, vertical clock/cable drivers 34, biasing circuits 37, video processing circuits 40, a cable 41 comprising conductors 12, 32, 33, 35, 36, 38 and 39, a correlated double sample and hold circuit 11, and a reset, sample and clamp generator (RSC generator) 30. CCD sensor 10 is typically formed in a first semiconductor (e.g., silicon) body (substrate, integrated circuit chip) with RSC generator 30 and correlated .double sample and hold circuit 11. Though not shown, an output of CCD sensor 10 is coupled to an input of correlated double sample and hold circuit 11 and a reset output of RSC generator 30 is coupled to CCD sensor 10 and sample and clamp outputs of RSC generator 30 are coupled to inputs of correlated double sample and hold circuit 11. Vertical and horizontal clock/cable drivers 31 and 34, biasing circuits 37 and video processing circuits 40 are typically formed on a second integrated circuit chip. CCD sensor system 29 performs the same basic function as the CCD sensor system of FIG. 1, but the CCD sensor system 29 is broken up into essentially two integrated circuit chips which are electrically coupled together by the conductors 12, 32, 33, 35, 36, 38 and 39 of the cable 41. This separation allows the number of connection wires to CCD sensor 10, correlated double sample and hold circuit and RSC generator 30 to be seven as compared &o the total of twelve wires needed for the CCD sensor system of FIG. 1. This allows for both reduced size and increased flexibility of cable 41 since it has only seven conductors and thus allows CCD sensor 10 to be easily positioned to any desired location.

Horizontal clock/cable drivers 31 are essentially the same as horizontal clock drivers 14 of FIG. 1 and have input lines H1 and H2 and are coupled to inputs of CCD sensor 10 via conductors (wires) 32 and 33. Vertical clock/cable drivers 34 are essentially &he same as vertical clock drivers 15 of FIG. 1 and have inputs V1, V2 and V3 and are coupled to CCD sensor 10 via conductors 35 and 36. Biasing circuits 37 are essentially the same as biasing circuits 13 of FIG. 1, have inputs +supply, supply and ground, and are coupled to CCD sensor 10 via conductors 38 and 39. An output of correlated double sample and hold circuit 11 is coupled via a conductor 12 to an input of video processing circuits 40 which has an output coupled to line PVO (Processed Video Output). Input Lines H1, H2, V1, V2, V3, +supply, −supply and ground and output line PVO are all part of a cable 42. In comparison with the prior art, the bulk of cable 42 is considerably reduced and its flexibility much enhanced.

Figure 5:
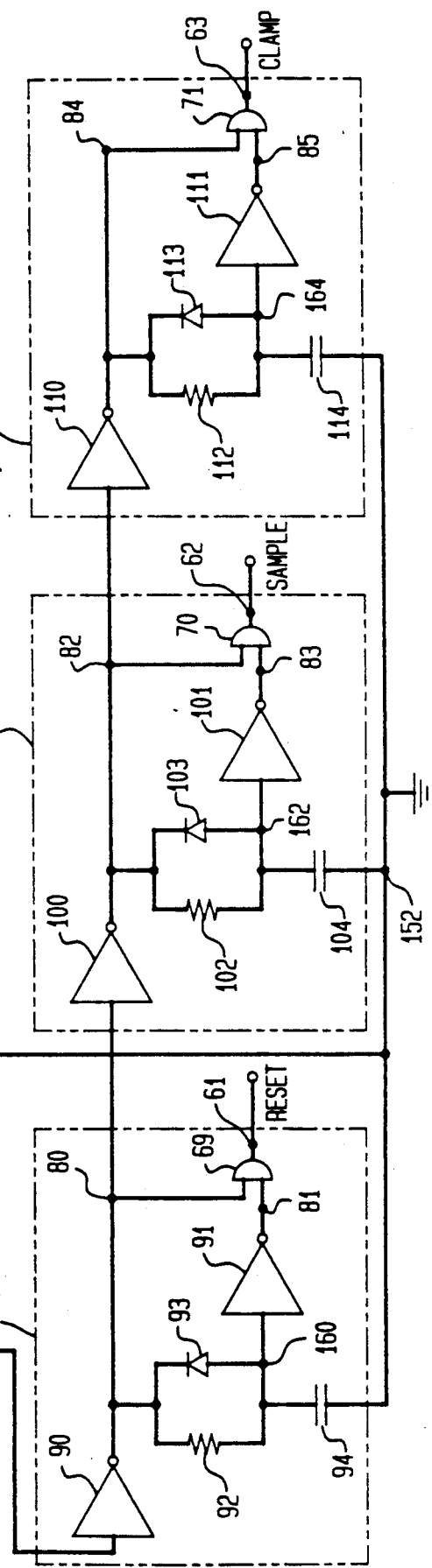
FIG. 5 is a schematic diagram of a specific reset, sample, and clamp pulse generator in accordance with the invention which is useful with the CCD sensor system of FIG. 2.
Figure 5:
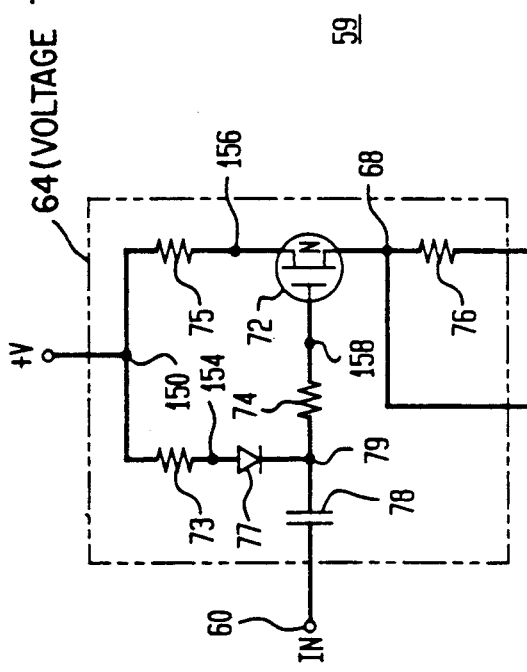

RSC generator 30 generates reset, sample and clamp pulses for CCD sensor 10 and correlated double sample and hold circuit 11 at transistor transistor logic (TTL) levels from signals already available at CCD sensor 10 for other purposes. The use of RSC generator 30 reduces the number of wires (conductors) needed to be coupled to CCD sensor 10 from components not on the same integrated circuit chip as CCD sensor 10. A specific embodiment of RSC generator 30 is shown in FIG. 5 and is described herein below.

One of the problems solved by the present invention is generation of reset, sample and clamp pulses at CCD sensor 10 at a TTL voltage levels even though the clock signals available (those from drivers 31 and 37) there to serve other needs can be highly variable with respect to both amplitude and d-c reference voltage. The horizontal clock signal on conductor 32 from driver 31, for example, may have ground as a d-c reference level and an amplitude of as much as fifteen volts or it may have minus twelve volts as a d c reference level and an amplitude of eight or less. Many other horizontal clock amplitudes and d-c reference levels are possible, depending upon the specific application and needs of CCD sensor 10. Swings of from plus two volts to plus ten volts, minus ten volts to minus two volts, and minus ten volts to plus five volts are other examples. For use with TTL semiconductor technology, however, the reset, sample, and clamp pulses should have ground as a d-c reference level and an amplitude of no more than about five volts. From one important point of view, the present invention makes it possible to generate Just such control pulses from an available clock signal, independent of the d-c reference level and amplitude of the available clock signal.

Referring now to FIG. 3, &here is shown a circuit 49 in accordance with the invention. Circuit 49 accomplishes a digital delay function, an inversion function and a voltage pulse generation function which are useful in the embodiment of RSC generator 30 which is shown in FIG. 5. Circuit 49 comprises first and second inverters 53 and 54, a resistor 55, a diode 56, a capacitor 57 and a two input AND gate 48. An input terminal 50 is connected to an input of inverter 53. A first output terminal 52 is coupled to an output of inverter 53, to a first terminal of resistor 55, to a first input of AND gate 48 and to the cathode of diode 56. A second terminal of resistor 55 is coupled to the anode of diode 56, to a first terminal of capacitor 57, to an input of inverter 54 and to a terminal 58. A second terminal of capacitor 57 is coupled to a reference voltage which is shown ground (zero volts). A second output terminal 51 is coupled to an output of inverter 54 and to a second input of AND gate 48. A third output terminal 47 is coupled to an output of AND gate 48. Diode 56 is poled, as shown, for easy current flow toward output terminal 52.

If an input signal applied to input terminal 50 is a low, a "0", then secondary output terminal 52 is high, a "1", and capacitor 57 charges exponentially through resistor 55 with a time constant determined by the resistance of resistor 55 and the capacitance of capacitor 57. If an input signal applied to input terminal 50 is a "1", then secondary output terminal 52 is a "0" and capacitor 56 discharges through resistor 55 and diode 57. Inverter 54 is used as a threshold detector. Its output changes from a "1" to a "0" when the voltage level at terminal 58 exceeds a preselected level which in one illustrative embodiment is +1.7 volts. In the illustrative embodiment inverters are coupled to voltage sources (not shown) of +5 volts and ground.

Referring now to FIG. 4, there is graphically shown voltage waveforms A, B, C, D and E versus time with waveform A representing an applied input signal at input terminal 50 and waveforms B, C, D and E representing the waveforms generated by the circuit 49 at the first output terminal 52, terminal 58, the second output terminal 51, and the third output terminal 47, respectively. Waveform B is essentially the inversion of waveform A. Waveform C shows the charging and discharging of terminal 58 with the horizontal dashed line indicating the voltage (i.e., the threshold voltage) at which inverter 54 switches output terminal 51 from a "1" to a "0". As shown by waveform D (the voltage of output terminal 51), the falling edge thereof is delayed until the threshold voltage of inverter 54 is reached. According, the waveform D is essentially the same as waveform A except that the falling edge thereof is delayed from the falling edge of waveform A. As shown by waveform E (the voltage of output terminal 47), a voltage pulse whose pulse width is equal in time to the time period in which output terminals 51 and 51 are both "1's" is generated at output terminal 54. The rising edge of the signal at input terminal 50 may be delayed instead of the falling edge, if desired, by reversing the polarity of diode 56. For consistency, whichever waveform edge is chosen &o be delayed can be regarded as the leading edge of the pulse.

Only during the time period that output terminals 51 and 52 are both "1's" is the output signal appearing at output terminal 54 a "1'". At all other times it is a "0". Thus a relatively narrow voltage pulse is generated from a single input voltage pulse having a wider pulse width. Circuit 49 also generates an inverted output signal at output terminal 52 and an inverted output signal with a delayed edge at output terminal 51.

Referring now to FIG. 5, there is shown a circuit 59 in accordance with an embodiment of the invention. Circuit 59, which is a specific embodiment of RSC generator 30 of FIG. 2, comprises a voltage translator circuit 64, essentially identical delay circuits 65, 66 and 67 and AND gates 69, 70 and 71. Each of delay circuits 65, 66 and 67 is essentially identical to and performs the same function as the circuit 49 of FIG. 3. Voltage translator circuit 64 comprises an n/channel field effect transistor (FET) 72, a diode 77, a capacitor 78 and four resistors 73, 74, 75 and 76. Delay circuit 65 comprises inverters 90 and 91, a diode 93, a resistor 92 and a capacitor 94. Delay circuit 66 comprises inverters 100 and 101, a diode 103, a resistor 102 and a capacitor 104. Delay circuit 67 comprises inverters 110 and 111, a diode 113, a resistor 112 and a capacitor 114. Voltage translator circuit 64 generates at an output terminal 68 thereof a voltage waveform which has the shape as an input signal applied to an input terminal 60 of circuit 59, but which has voltage levels that vary between the level of a positive voltage source +V and a reference voltage which is shown as ground (zero volts). Delay circuit 65 and AND gate 69 generate at an output terminal 61 of AND gate 69, a RESET signal which is useful with CCD sensor system 29 of FIG. 2. Delay circuit 66 and AND gate 70 generate at an output terminal 62 of AND gate 70, a SAMPLE signal which is useful with CCD sensor system 29 of FIG. 2. Delay circuit 67 and AND gate 71 generate at an output terminal 63 of AND gate 71, a CLAMP signal which is useful with CCD sensor system 29 of FIG. 2.

Although not shown, inverters 90, 91, 100, 101, 110 and 111 are all coupled to +V and ground. The generated RESET, SAMPLE and CLAMP waveforms all vary in voltage between +V and ground, independent of the amplitude and voltage levels of an input signal applied to input terminal 60.

First terminals of resistors 73 and 75 are coupled to a terminal 150 and to the voltage source +V. First terminals of resistor 76 and capacitors 94, 104 and 114 are coupled to a terminal 152 which is coupled to ground. The input &terminal 60 is coupled to a first terminal of capacitor 78. A second terminal of capacitor 78 is coupled to the cathode of diode 77, to a first terminal of resistor 74 and to a terminal 79. A second terminal of resistor 74 is coupled to the gate of FET 72 and to a terminal 158. A second terminal of resistor 73 is coupled to the anode of diode 77 and to a terminal 154. A second terminal of resistor 75 is coupled to the drain of FET 72 and to a terminal 156. The source of FET 72 is coupled to a second terminal of resistor 76, to an input of inverter 90, to an output terminal of translation circuit 64 and to a terminal 68.

An output of inverter 90 is coupled to a first terminal of resistor 92, to the cathode of diode 93, to a first input of AND gate 69, to an input of inverter 100 and to a terminal 80. A second terminal of resistor 92 is coupled to the anode of diode 93, to a second terminal of capacitor 94, to an input of inverter 91 and to a terminal 160. An output of inverter 91 is coupled to a second input of AND gate 69 and to a terminal 81.

An output of inverter 100 is coupled to a first terminal of resistor 102 to the cathode of diode 103, to a first input of AND gate 70, to an input of inverter 110 and to a terminal 82. A second terminal of resistor 102 is coupled to the anode of diode 103, to a second terminal of capacitor 104, to an input of inverter 101 and to a terminal 162. An output of inverter 101 is coupled to a second input of AND gate 70 and to a terminal 83.

An output of inverter 110 is coupled to a first terminal of resistor 112, to the cathode of diode 113, to a first input of AND gate 71 and to a terminal 84. A second terminal of resistor 112 is coupled to the anode of diode 113, to a second terminal of capacitor 114, to an input of inverter 111 and to a terminal 164. An output of inverter 111 is coupled &o a second input of AND gate 71 and to a terminal 85.

When circuit 59 is used as the RSC generator 30 of FIG. 2, input terminal 60 receives the horizontal clock signal on conductor 32 of CCD sensor system 29. That clock signal is typically a high frequency (of the order of fifteen megahertz or more) signal which has, for example, an amplitude of fifteen volts and a d-c reference level of ground. As has already been pointed out, the horizontal clock may have other amplitudes and d-c reference levels instead, the particular combination depending upon the needs of the CCD sensor 10 and its associated circuitry.

Figure 6:
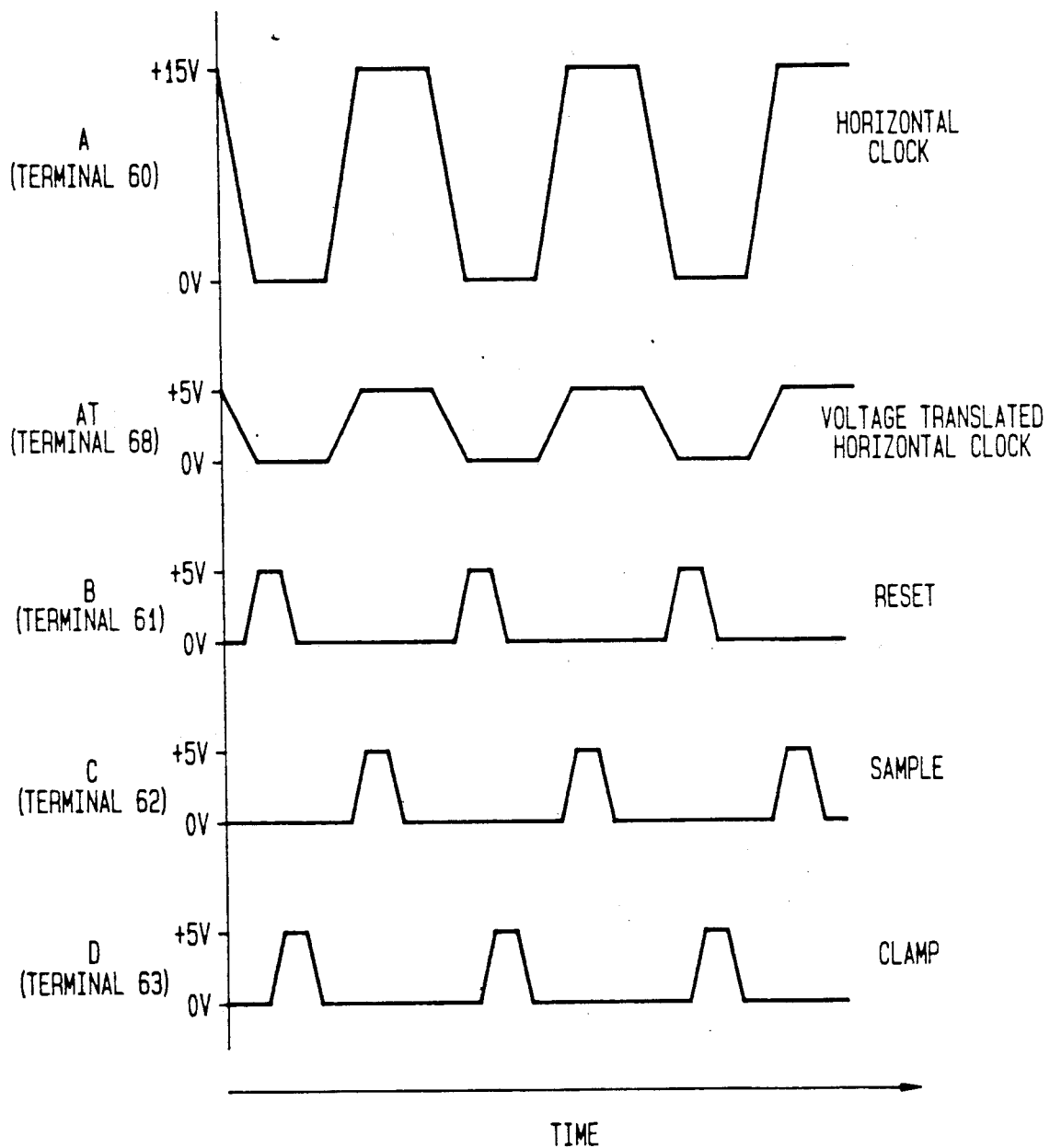
FIG. 6 graphically shows voltage waveforms which illustrate the operation of the circuit of FIG. 5.

Referring now to FIG. 6, there is graphically shown voltage waveforms A (terminal 60), AT (terminal 68), B (terminal 61), C (terminal 62) and D (terminal 63) versus time for &he circuit 59 of FIG. 5. Waveform A shows the horizontal clock signal on line 32 of CCD sensor system 29 of FIG. 2 applied to input terminal 60; waveform AT shows the output signal of translation circuit 64 at output terminal 68; and waveforms B, C, and D show the reset, sample, and clamp pulse waveforms appearing at output terminals 61, 62, and 63, respectively. In the example given, the horizontal clock signal has zero voltage (i.e., ground) as its d-c reference level and plus fifteen volts as its amplitude. As has been pointed out, however, &he horizon&al clock signal is subJect to wide differences, depending upon the particular CCD sensor application involved. A d-c reference level of minus twelve volts and a maximum of minus four volts might be equally likely in another application. The reset, sample, and clamp pulses, however, are all intended &o have the same d-c reference level and amplitude and to be consistent with the requirements of TTL circuitry. In an illustrative embodiment, the d-c reference level is ground and the amplitude is plus five volts. The relative timing of the reset, sample, and clamp pulses is important. As shown, the reset and clamp pulses occur during one phase of the horizontal clock signal and the sample pulses occur during the next phase of the horizontal clock signal.

In operation of the circuit 59 of FIG. 5, translation circuit 64 receives the horizontal clock signal at input terminal 60. In an illustrative example positive voltage source +V provides approximately five volts and is clamped to the output side of coupling capacitor 78 by the combination of resistor 73 and diode 77. Resistor 74 serves to reduce transient ripple and oscillations and FET 72 operates as a switch during larger horizontal clock excursions to connect output terminal 68 between +5 volt source +V or and ground (zero volts). The horizontal clock signal amplitude may even be quite small, however. Below a certain amplitude and even as low as two and a half volts, FET 72 operates as a source follower accomplishing substantially the same result. The waveform at terminal 68, is in phase with the horizontal clock signal but is thus confined to an amplitude of five volts and effectively clamped to a d-c reference level of ground.

Within circuit 65, inverter 90 supplies an inverted replica of the waveform from terminal 68 to terminal 80. The time constant of resistor 92 and capacitor 94 delays the leading edge of the terminal 80 waveform in the manner described in connection with the circuit 49 of FIG. 3. The outputs of inverters 90 and 91 are thus both supPlied to AND gate 69 and the output of &he latter appears at reset pulse output terminal 61 as the waveform B (RESET) of FIG. 6.

The operation within circuit 66 is similar, but slightly delayed because of transmission delay occurring within inverter 90. Inverter 100 supplies an inverted replica of the waveform from terminal 80 to terminal 82. The time constant of resistor 102 and capacitor 104 delays the leading edge of the terminal 82 waveform in the manner described in connection with the circuit 49 of FIG. 3. The outputs of inverters 100 and 101 are both supplied to AND gate 70 and the output of the latter appears at sample pulse output terminal 62 as the waveform C (SAMPLE) of FIG. 6.

Finally, the operation within circuit 67 is also similar, but delayed still more because of the additional transmission delay occurring within inverter 100. Inverter 110 supplies an inverted replica of the waveform from terminal 82 to terminal 84. The time constant of resistor 112 and capacitor 114 delays the leading edge of the terminal 84 waveform in the manner of circuit 49 of FIG. 3. The outputs of inverters 110 and 111 are both supplied to AND gate 71 and the output of the latter appears at clamp pulse output terminal 73 as the waveform D (CLAMP) of FIG. 6.

In a typical embodiment of circuit 59 of FIG. 5, +V=+5.0 volts, resistors 73, 74, 75, 76, 92, 102 and 112 are 10,000, 270, 4,700, 3,900, 12,000, 390 and 390 ohms, respectively, and capacitors 78, 94, 104 and 114 are 0.1 microfarads, 10picofarads, 10 picofarads and 10 picofarads, respectively.

It is to be understood that the embodiments of the invention which have been described are illustrative. Modifications may readily be devised by those skilled in the art without departing from the spirit and scope of the invention. For example, other translation or delay circuits may be employed if desired and diode polarities may be reversed if transistor conductivity types and supply voltage polarities are reversed as well. Still further, non inverting threshold detectors may be used instead of inverters in control pulse generators embodying the invention as long as the same change is made consistently throughout any particular application. Furthermore, the circuitry 49 of FIG. 3 can used without the AND gate 48 and with terminals 52 and/or 51 being the outputs. Still further, the circuit 49 of FIG. 3 is useful without inverter 53 and thus with input terminal 50 being the same as terminal 52.

What is claimed is:

1. Circuitry comprising:
a switching device having a control terminal and first and second output terminals; p1 first, second and third resistors each having first and second terminals;
a diode having an anode and cathode;
a-c coupling means having first and second terminals for coupling an ac component of a signal applied to the first terminal thereof to the second terminal thereof;
a circuitry input terminal being coupled to the first terminal of the ac coupling means;
a circuitry output terminal being coupled to the first output terminal of the switching device and to a the first terminal of the first resistor;
a first terminal of the second resistor being coupled to the anode of the diode;
the cathode of the diode being coupled to the second terminal of the ac coupling means and to the control terminal of the switching device;
a first terminal of the third resistor being coupled to the second output terminal of the switching device;
second terminals of the second and third resistors being coupled to a first voltage supply terminal; and
the second terminal of the first resistor being coupled to a second voltage supply terminal.

2. The circuitry of claim 2 further comprising a fourth resistor having a first terminal coupled to the anode of the diode and to the second terminal of the ac coupling means and having a second terminal coupled to the control terminal of the switching device such that the ac coupling device and the diode are both coupled to the control terminal of the switching device through the fourth resistor.

3. The circuitry of claim 1 wherein the a-c coupling means is a capacitor and the switching device is a tranisistor.

4. The circuitry of claim 3 wherein the transistor is an n-channel field effect transistor.

* * * * *